United States Patent
Chaudhuri et al.

(10) Patent No.: US 11,158,709 B2
(45) Date of Patent: Oct. 26, 2021

(54) POLARIZATION-INDUCED 2D HOLE GASES FOR HIGH-VOLTAGE P-CHANNEL TRANSISTORS

(71) Applicant: Cornell University, Ithaca, NY (US)

(72) Inventors: Reet Chaudhuri, Ithaca, NY (US); Samuel James Bader, Hillsboro, OR (US); Jena Debdeep, Ithaca, NY (US); Huili Grace Xing, Ithaca, NY (US)

(73) Assignee: Cornell University, Ithaca, NY (US)

( * ) Notice: Subject to any disclaimer, the term of this patent is extended or adjusted under 35 U.S.C. 154(b) by 0 days.

(21) Appl. No.: 17/261,309

(22) PCT Filed: Jul. 19, 2019

(86) PCT No.: PCT/US2019/042584
§ 371 (c)(1),
(2) Date: Jan. 19, 2021

(87) PCT Pub. No.: WO2020/018895
PCT Pub. Date: Jan. 23, 2020

(65) Prior Publication Data
US 2021/0249513 A1     Aug. 12, 2021

Related U.S. Application Data

(60) Provisional application No. 62/701,219, filed on Jul. 20, 2018.

(51) Int. Cl.
*H01L 29/778*     (2006.01)
*H01L 29/267*     (2006.01)
(Continued)

(52) U.S. Cl.
CPC ............ *H01L 29/267* (2013.01); *H01L 29/04* (2013.01); *H01L 29/045* (2013.01);
(Continued)

(58) Field of Classification Search
None
See application file for complete search history.

(56) References Cited

U.S. PATENT DOCUMENTS

| | | |
|---|---|---|
| 8,785,904 B2 | 7/2014 | Zhang |
| 9,006,791 B2 | 4/2015 | Kub |
| (Continued) | | |

OTHER PUBLICATIONS

Chaudhuri, R., et al., "A polarization-induced 2D hole gas in undoped gallium nitride quantum wells" arXiv: 1807.08836 [cond-mat.mtrl-sci] Jul. 23, 2018 (Jul. 23, 2018).
(Continued)

*Primary Examiner* — Grant S Withers
(74) *Attorney, Agent, or Firm* — Culhane Meadows PLLC; Orlando Lopez

(57) ABSTRACT

The long-missing polarization-induced two-dimensional hole gas is finally observed in undoped Group III nitride semiconductor structures and in undoped Group II or Group III oxide semiconductor structures. Experimental results providing unambiguous proof that a 2D hole gas in GaN grown on AlN does not need acceptor doping, and can be formed entirely by the difference in the internal polarization fields across the semiconductor heterojunction are presented.

38 Claims, 8 Drawing Sheets

(51) Int. Cl.
*H01L 29/66* (2006.01)
*H01L 29/04* (2006.01)
*H01L 29/20* (2006.01)
*H01L 29/225* (2006.01)
*H01L 29/205* (2006.01)

(52) U.S. Cl.
CPC ........ *H01L 29/2003* (2013.01); *H01L 29/205* (2013.01); *H01L 29/225* (2013.01); *H01L 29/66462* (2013.01); *H01L 29/7786* (2013.01); *H01L 29/7787* (2013.01)

(56) References Cited

U.S. PATENT DOCUMENTS

| | | |
|---|---|---|
| 9,087,889 B2 | 7/2015 | Nakajima |
| 2014/0264379 A1* | 9/2014 | Kub .................. H01L 29/66477 257/77 |
| 2018/0323106 A1* | 11/2018 | Dasgupta .......... H01L 21/02458 |
| 2020/0194312 A1* | 6/2020 | Then ................ H01L 29/66462 |
| 2021/0005759 A1* | 1/2021 | Then .................. H01L 29/0649 |

OTHER PUBLICATIONS

Nakajima, A., et al., "High Density Two-Dimensional Hole Gas Induced by Negative at GaN/AlGaN Heterointerface." Applied Physics Express 3 (2010) Dec. 10, 2004.
Ekpunobi, A.J. and Animalu, A.O.E., "Band offsets and properties of AlGaAs/GaAs and AlGaN/GaN material systems." Superlattices and Microstructures, vol. 31, No. 5 (2002).

* cited by examiner

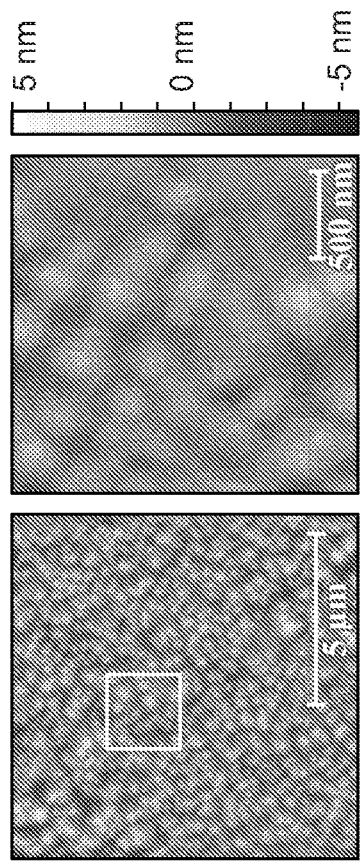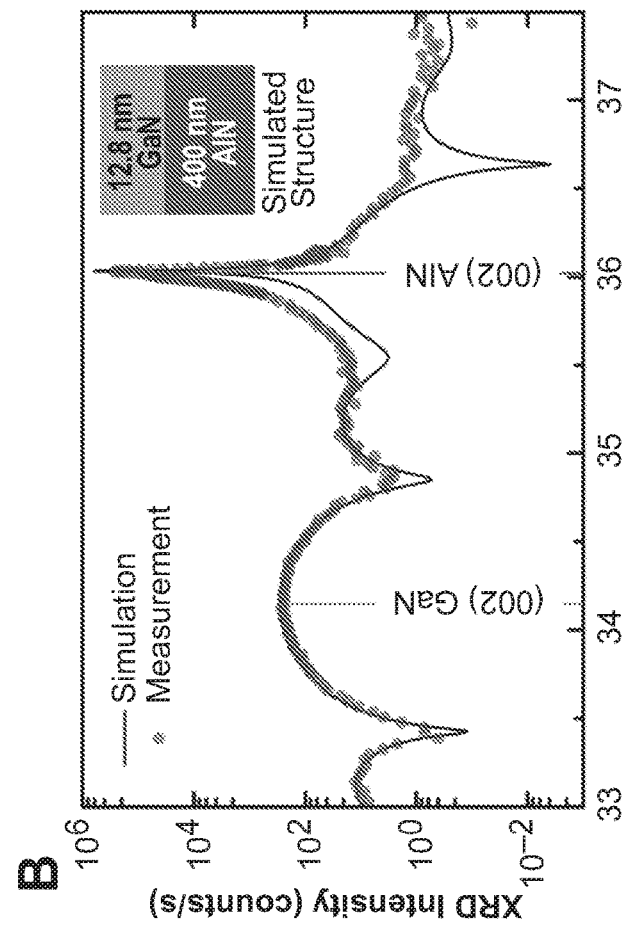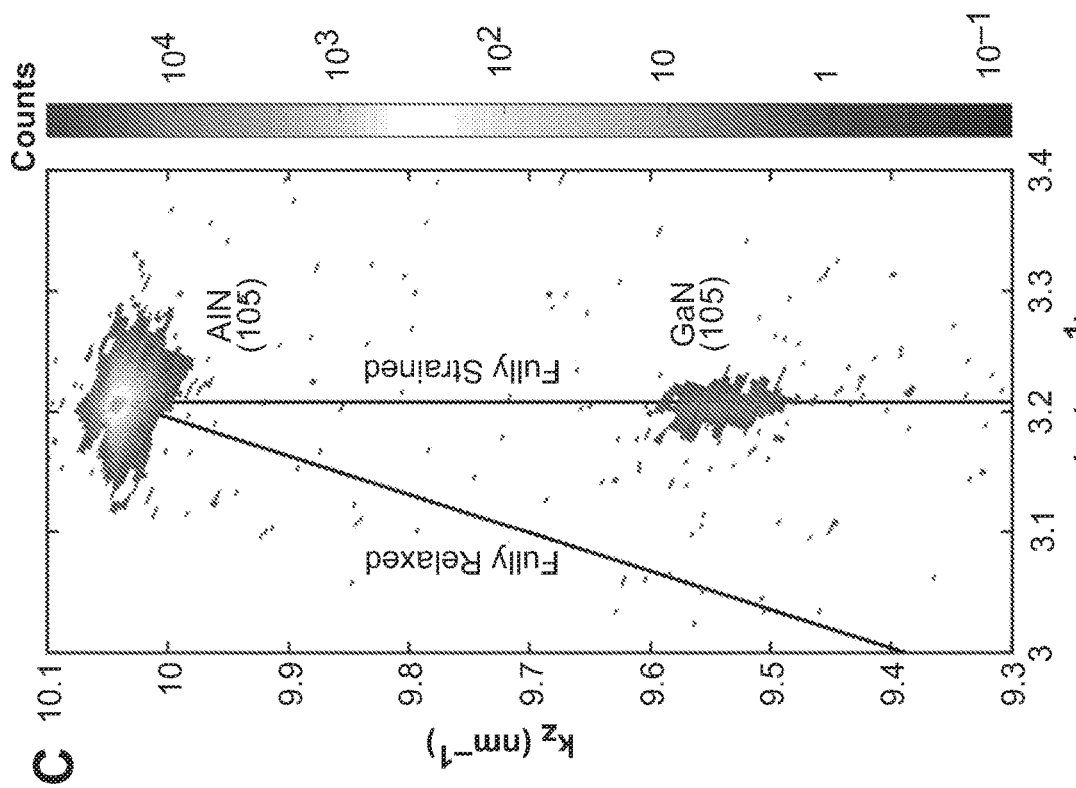
Fig. 2A
Fig. 2B
Fig. 2C

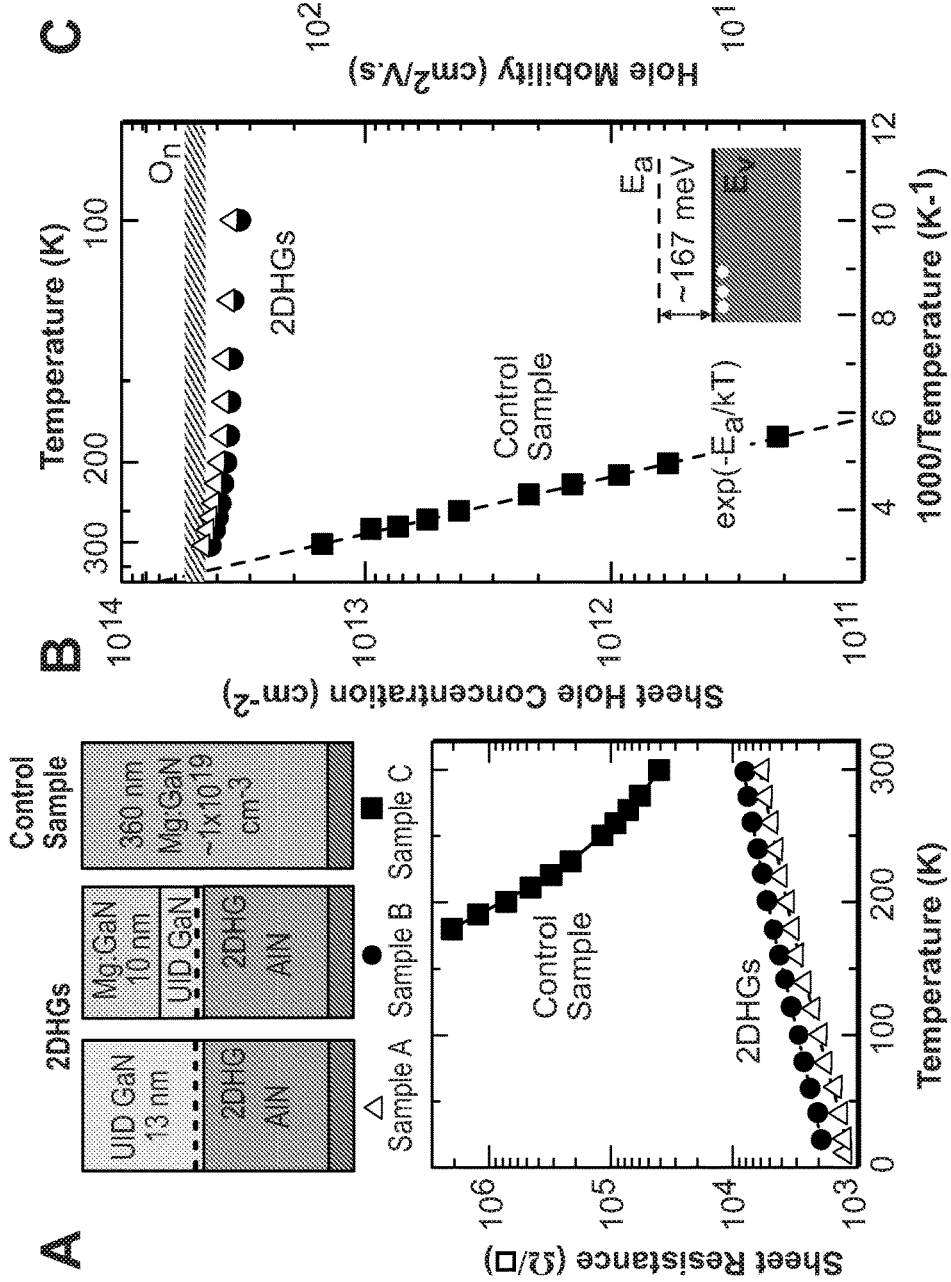
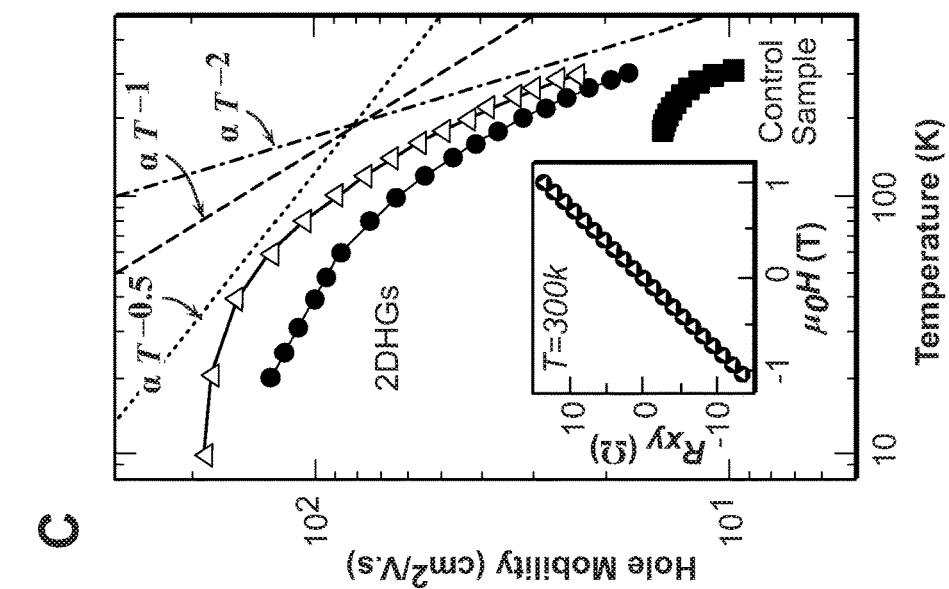
Fig. 3A    Fig. 3B    Fig. 3C

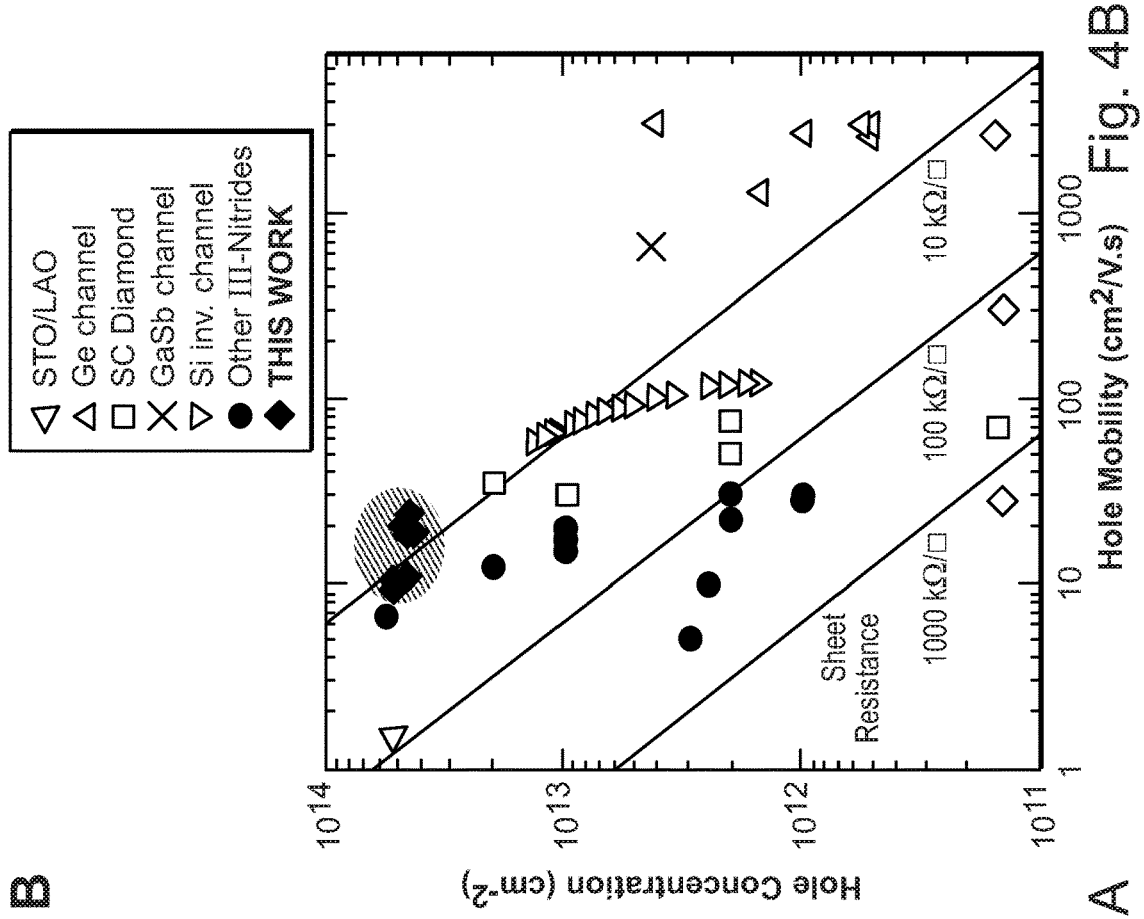
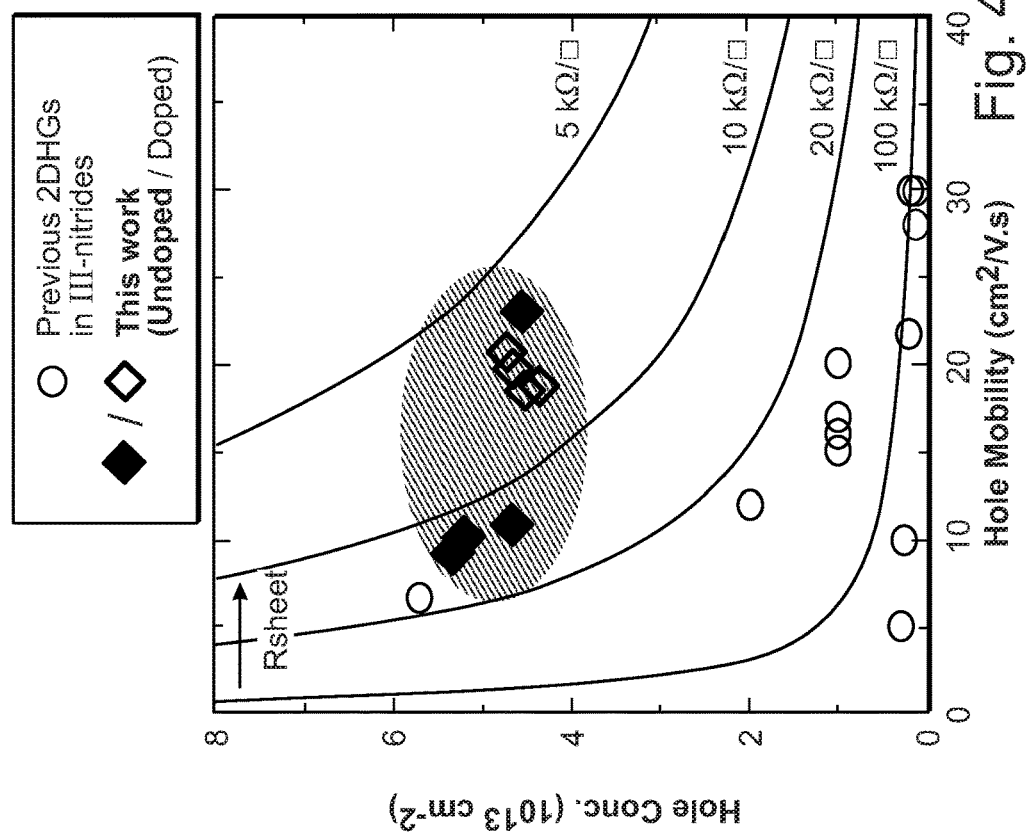
Fig. 4A
Fig. 4B

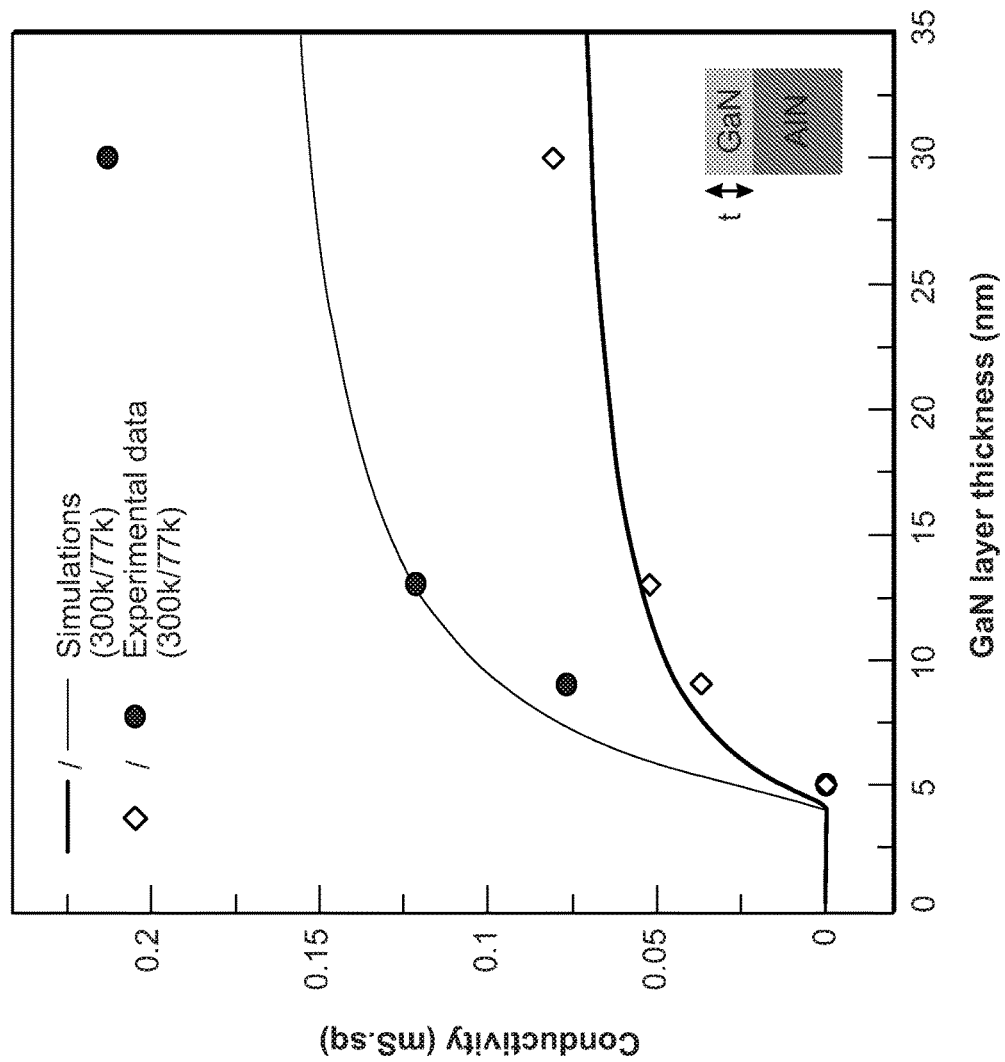
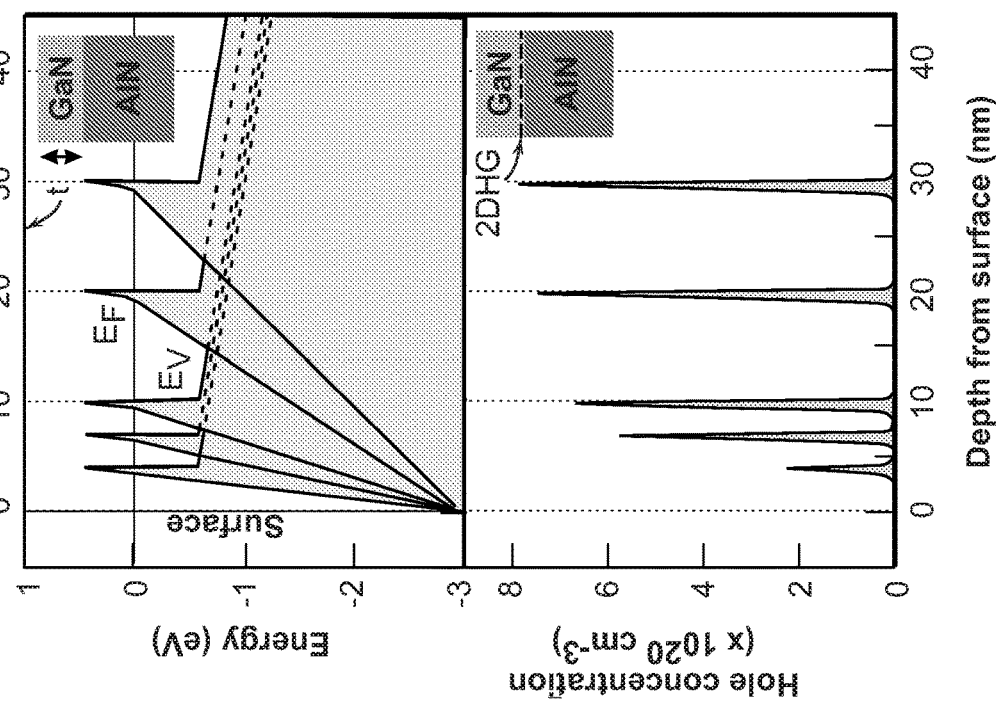
Fig. 7A
Fig. 7B

POLARIZATION-INDUCED 2D HOLE GASES FOR HIGH-VOLTAGE P-CHANNEL TRANSISTORS

CROSS-REFERENCE TO RELATED APPLICATIONS

This application is a U.S. national stage application under 35 U.S.C. 371 of co-pending International Application No. PCT/US2019/042584 filed on Jul. 19, 2019 and entitled POLARIZATION-INDUCED 2D HOLE GASES FOR HIGH-VOLTAGE P-CHANNEL TRANSISTORS, which in turn claims priority to U.S. Provisional Patent Application No. 62/701,219, filed Jul. 20, 2018, both of which are incorporated herein by reference in their entirety and for all purposes.

STATEMENT REGARDING FEDERALLY SPONSORED RESEARCH OR DEVELOPMENT

This invention was made partially with U.S. Government support from the National Science Foundation under grant number 1710298 and 1534303 and from the Air Force office of Sponsored Research (AFOSR) under grant number AFOSR FA9550-17-1-0048. The U.S. Government has certain rights to the invention.

BACKGROUND

These teachings relate generally to high conductivity 2D hole gas in an undoped and doped semiconductor heterostructures.

Currently, no efficient high conductivity p-type doping scheme is available for wide gapnitride and oxide semiconductors. This has held back the development of high performance p-channel transistors, and consequently complementary high voltage logic electronics. A high-voltage complementary logic device will enable significant energy savings, and is highly desired in mobile communications and data centers. For example, it will cause a large increase in the effective battery life of a cell-phone, and will cause computers and data centers to consume much less energy than they currently do. This is possible because a high-voltage complementary logic device can directly convert from ~48 Volt supplies to the ~1 Volt necessary for computation in the microprocessor without going through several stages of voltage down-conversion, where energy is lost in each step. A single high-voltage complementary device also shrinks the size of the electronics by making extra power convertors unnecessary, making cell phones lighter.

No p-channel high voltage transistor exists today, because p-type doping is a major problem in wide-bandgap semiconductors such as Group III-nitrides and oxide semiconductors (such as ZnO, and $Ga_2O_3$). There exists Mg doping of GaN which is widely used to obtain p-type doped GaN, but these it results in low conductivity, unsuitable for high-performance transistors. There are demonstrations of a 2-dimensional hole gas (2DHG) in III-nitrides, but they all have been on p-type doped structure and/or have a 2D electron gas (2DEG) in the structure as well, with sub-par conductivity, and consequently, unsuitable for making p-channel devices with performance levels necessary for high voltage CMOS.

BRIEF SUMMARY

Semiconductor devise heterostructures that result in a high conductivity 2D hole gas are disclosed hereinbelow.

In one or more embodiments, the Group III nitride semiconductor device of these teachings includes a first layer of a first polar undoped Group III nitride material grown on an undoped substrate material and a second layer of an undoped second polar Group III nitride material epitaxially grown on the first layer of the first polar undoped Group III nitride material. A difference between the normal component of the polarization of the second layer of the undoped second polar Group III nitride material and the first layer of the first polar undoped Group III nitride material is negative. There is an energy band offset between valence bands of the first polar undoped Group III nitride material and the undoped second polar Group III nitride material. A 2D hole gas is formed at a heterojunction between the first layer of the first polar undoped Group III nitride material and the second layer of the undoped second polar Group III nitride material. A 2D electron gas is not present.

Embodiments of heterostructures of wide bandgap oxide semiconductor materials, including Group II or Group III oxides, such as ZnO or $Ga_2O_3$, are within the scope of these teachings. Embodiments in both crystallographic polarities are also within the scope of these teachings.

In one or more embodiments, the method for fabricating a Group III nitride semiconductor device having a 2D hole gas includes depositing a first layer of a first polar undoped Group III nitride material on an undoped substrate, and epitaxially growing a second layer of an undoped second polar Group III nitride material on the first layer of the first polar undoped Group III nitride material. A difference between the normal component of the polarization of the second layer of the undoped second polar Group III nitride material and the first layer of the first polar undoped Group III nitride material is negative. There is an energy band offset between valence bands of the first polar undoped Group III nitride material and the undoped second polar Group III nitride material. A 2D hole gas is formed at a heterojunction between the first layer of the first polar undoped Group III nitride material and the second layer of the undoped second polar Group III nitride material. A 2D electron gas is not present. Embodiments of the method that include Group II or Group III oxides, such as ZnO or $Ga_2O_3$, are within the scope of these teachings. Embodiments in both crystallographic polarities are also within the scope of these teachings.

For a better understanding of the present teachings, together with other and further needs thereof, reference is made to the accompanying drawings and detailed description.

BRIEF DESCRIPTION OF THE DRAWINGS

FIGS. 2A-2C show structural properties of the MBE-grown GaN/AlN heterostructures in one embodiment of these teachings;

FIGS. 3A-3C show results of temperature-dependent Hall-effect measurements from 300K to 20K at 1T magnetic field of 2DHG embodiments A, B, along with Sample C: a p-type doped GaN control sample;

FIGS. 4A and 4B show comparison of room temperature transport properties the 2D hole gas of these teachings and other 2D hole gases;

FIG. 7A, 7B show dependence of the properties of the polarization-induced 2D hole gas on the thickness of the undoped strained GaN layer grown on AlN.

DETAILED DESCRIPTION

Figure 1:
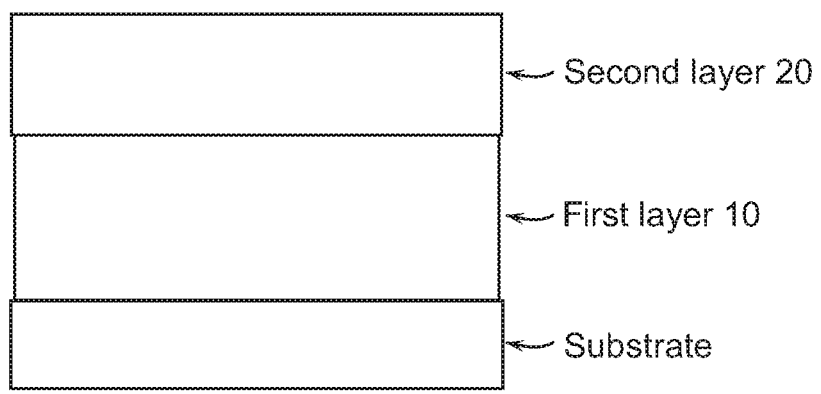
FIG. 1 shows a schematic representation of an epitaxially grown heterostructure of these teachings.

The following detailed description presents the currently contemplated modes of carrying out the invention. The description is not to be taken in a limiting sense, but is made merely for the purpose of illustrating the general principles of the invention, since the scope of the invention is best defined by the appended claims.

Group III, as used herein, refers to CAS Group IIIA (Triels or the Boron group) in the periodic table.

Group II, as used herein, refers to CAS Group IIB (the zinc family) in the periodic table.

III-nitride semiconductor materials, as used herein, refers to (Al, In, Ga and their alloys) N.

Oxide semiconductor materials, as used here in, refers to Group II or Group III oxides, such as ZnO or $Ga_2O_3$. The total macroscopic polarization P of a Group III nitride layer or Group II or Group III oxide layer, in the absence of external electric fields, as used herein, is the sum of the spontaneous polarization $P_{SP}$ in the equilibrium lattice, and the strain-induced or piezoelectric polarization $P_{PE}$. (See, for more details, O. Ambacher et al., Two-dimensional electron gases induced by spontaneous and piezoelectric polarization charges in N-and Ga-face AlGaN/GaN heterostructures. *J. Appl. Phys.* 85, 3222-3233 (1999), which is Incorporated by reference here in in its entirety and for all purposes.)

"Noncentrosymmetric compound crystals exhibit two different sequences of the atomic layering in the two opposing directions parallel to certain crystallographic axes, and consequently crystallographic polarity along these axes can be observed. For binary A-B compounds with wurtzite structure, the sequence of the atomic layers of the constituents A and B is reversed along the [0001] and [000$\bar{1}$] directions" (See, for more details, O. Ambacher et al., Two-dimensional electron gases induced by spontaneous and piezoelectric polarization charges in N-and Ga-face AlGaN/GaN heterostructures. *J. Appl. Phys.* 85, 3222-3233 (1999)).

"Polar," as used herein, refers to one of those two crystallographic polarities. It should be noted that both Group III nitrides and oxide semiconductors are A-B compounds and will both exhibit two crystallographic polarities.

Metal polar, as used herein, refers to the crystallographic polarity along the [0001] axis of a Group III N compound with wurtzite structure. (See, for more details, O. Ambacher et al., Two-dimensional electron gases induced by spontaneous and piezoelectric polarization charges in N-and Ga-face AlGaN/GaN heterostructures. *J. Appl. Phys.* 85, 3222-3233 (1999), pp. 3224-3225.)

N polar, as used herein, refers to the crystallographic polarity along the [000$\bar{1}$] axis of a Group III N compound with wurtzite structure.

Undoped, as used herein, refers to material for which there have been no active or intentional doping.

An energy bandgap, as used herein, refers to the energy difference (in electron volts) between the top of the valence band and the bottom of the conduction band in insulators and semiconductors.

A 2D charged particle gas (2D hole gas or 2D electron gas) is an ensemble of charged particles of the same charge that is free to move in two dimensions, but tightly confined in the third.

The discovery of p-type doping of the wide-bandgap semiconductor gallium nitride (GaN) around 1990 changed the field of semiconductor physics. It enabled the immediate realization of bright blue light emitting diodes and lasers, and started the solid-state lighting revolution, which today has transformed the lives of a large fraction of the population of the planet. To make energy-efficient visible lighting successful, it is necessary to inject both electrons and holes from supply layers in GaN into InGaN quantum wells, where they recombine and produce photons of desired wavelengths. This requires the complementary n-type doping of GaN too, which was fortunately available for several decades before the discovery of p-type doping. While holes are generated by substitution of Ga atoms in the GaN crystal by Mg acceptor atoms, n-type doping is achieved by replacing Ga by Si or Ge donor atoms.

In the mid-1990s, high conductivity quantum-confined 2D electron gases were discovered at the heterointeface of AlGaN/GaN structures (4). Most remarkably, these 2D electron gases (2DEGs) did not require the presence of dopants. A few years after the observation, the reason for the formation of the 2DEG was tracked down to the existence of broken inversion symmetry in the GaN crystal, combined with the very high polarity of the metal-nitrogen bond in GaN and AlN. These properties lead to the existence of spontaneous and piezoelectric electronic polarization fields along the 0001 axis of the wurtzite nitride semiconductor crystal. The resulting polarization-induced 2D electron gas at Al(Ga)N/GaN heterojunctions has, in the last two decades, enabled high-voltage and ultra-high speed transistors that are being adopted in power electronics, and high-speed cellular communications in the RF and millimeter wave.

The p-type analog of the undoped polarization-induced 2D electron gas—the undoped 2D hole gas has, however, remained elusive till these teachings. Although low density 2D hole gases have been previously inferred in nitride heterojunctions such as in GaN/AlGaN/GaN, GaN/InGaN/GaN, GaN/AlInGaN/GaN-, GaN/AlGaN, and GaN/AlN, these structures have been either p-type modulation doped heterostructures, or structures that have both electron and hole gases present. The missing dual piece of the undoped 2D hole gas has held back the widespread use of GaN for complementary logic electronics for digital applications till today, just like the absence of bulk p-doping had held back high efficiency photonic devices till the 90s. Significant advances in energy-efficient electronics can be enabled by GaN based high-voltage complementary low loss switches exploiting the large bandgap of the semiconductor, if a high conductivity undoped 2D hole gas can be found.

In these teachings, a Group III nitride semiconductor device having a first layer of a first polar undoped Group III nitride material or a or Group II or Group III oxide material (10, FIG. 1) is grown on an undoped substrate and a second layer of an undoped second polar Group III nitride material (20, FIG. 1) or Group II or Group III oxide material, epitaxially grown on the first layer of the first polar undoped Group III nitride material or Group II or Group III oxide material. For some crystal structures and choice of materials, a difference between the normal component of the polarization of the second layer of the undoped second polar Group III nitride material or Group II or Group III oxide material and the first layer of the first polar undoped Group III nitride material or Group II or Group III oxide material is negative. For the same crystal structure and choice of materials, there is an energy band offset between valence bands of the first polar undoped Group III nitride material or Group II or Group III oxide material and the undoped second polar Group III nitride material or Group II or Group III oxide material. Under those conditions, holes are confined in the direction perpendicular to the heterojunction between the first layer of the first polar undoped Group III nitride material or Group II or Group III oxide material 10 and the second layer of the undoped second polar Group III nitride material or Group II or Group III oxide material 20 but can move freely in directions part to the heterojunction, thereby forming a 2D hole gas at the heterojunction. A 2D electron gas is not present. In the embodiment shown in FIG. 1, the first layer of the first polar undoped Group III nitride material or Group II or Group III oxide material is deposited on an undoped substrate.

Embodiments in which the first polar undoped Group III nitride material is undoped polar AlN and the second polar Group III nitride material is undoped polar GaN, the first polar undoped Group III nitride material is undoped polar AlN and the second polar Group III nitride material is one of undoped polar $In_xGa_{1-x}N$ or $Al_xGa_{1-x}N$ where x is a number less than 1 and greater than 0 (including any combination), wherein the first polar undoped Group III nitride material is undoped 1 polar $Al_xGa_{1-x}N$ and the second polar Group III nitride material is one of undoped polar GaN or $In_xGa_{1-x}N$ where x is a number less than 1 and greater than 0, or wherein the first polar undoped Group III nitride material is undoped polar $Al_xIn_yGa_{(1-(x+y))}N$ where x and y are numbers less than 1 and greater than 0, the sum of x and y being less than 1, and the second 1 polar Group III nitride material is undoped polar GaN are within the scope of these teachings.

These teachings include embodiments in which a polarity of semiconductor materials in the structure is metal polar and embodiments in which a polarity of semiconductor materials is N polar.

Embodiments in which the first polar undoped Group II oxide material is undoped polar ZnO and the second polar Group II oxide material is undoped polar $Zn_xMg_{1-x}O$ where x is a number less than 1 and greater than 0, or in which the first polar undoped Group III oxide material is undoped polar $Ga_2O_3$ and the second polar Group III oxide material is one of undoped polar $(Al_xGa_{1-x})_2O_3$ where x is a number less than 1 and greater than 0, are within the scope of these teachings. Embodiments in which the polarity of the semiconductor materials is metal polar and embodiments in which the polarity of semiconductor materials is O polar are within the scope of these teachings.

Embodiments with multiple Group III polar nitride material interfaces as above forming multiple 2D hole gas channels with necessary compensation doping necessary to prevent the formation of 2D electron channels—no mobile electrons are present, are within the scope of these teachings.

Embodiments in which the undoped substrate is one of Sapphire, c-plane Sapphire, undoped bulk single crystal AlN, undoped bulk single crystal polar AlN, silicon carbide, Si-face silicon carbide or silicon are within the scope of these teachings.

These teachings provide:
  Completely undoped wide bandgap semiconductor heterostructures
  High p-type conductivity
  Wide bandgap for high voltage p-channel transistor
  Can be fabricated by MOCVD and MBE, both industrially used techniques In another embodiment, the Group III nitride semiconductor device also includes a layer of p doped second polar Group III nitride material disposed on the second layer of the undoped second polar Group III nitride material. The layer of p doped second polar Group III nitride material disposed on the second layer of the undoped second polar Group III nitride material can be, in one instance, formed by doping an upper portion of the second layer 20 of the undoped second polar Group III nitride material. Embodiments of heterostructures of wide bandgap oxide semiconductor materials, including Group II or Group III oxides, such as ZnO or $Ga_2O_3$, are within the scope of these teachings. Embodiments in both crystallographic polarities are also within the scope of these teachings.

In order to further elucidate these teachings, an exemplary embodiment is presented herein below. It should be noted that these teachings are not limited only to the exemplary embodiment. In the exemplary embodiment, the first metal polar undoped Group III nitride material 10 is undoped metal polar AlN and the second metal polar Group III nitride material 20 is metal polar GaN.

GaN and AlN in the wurtzite crystal structure have a broken inversion symmetry along the 0001 axis or the c-direction, leading to the existence of spontaneous polarization $P_{sp}^{GaN}$ and $P_{sp}^{AlN}$ in them. This implies the existence of two distinct polarities: we consider metal-polar structures in this work. Because AlN has a smaller lattice constant than GaN, a thin epitaxial layer of AlN grown on top of a relaxed GaN layer is compressively strained, leading to a piezoelectric polarization $P_{pz}^{AlN}$. The spontaneous and piezoelectric polarization fields add in the AlN layer, and the difference across the AlN/GaN heterojunction, $$[(P_{sp}^{AlN}+P_{pz}^{AlN})-P_{sp}^{GaN}]\cdot\hat{n}=\sigma_\pi$$

is the net fixed polarization sheet charge density formed at the heterojunction. If the crystal is oriented in the metal-polar direction, this fixed polarization sheet charge is positive in sign. Combining this polarization charge and the resulting electric field, with the electron potential energy barrier provided by the large energy band offset $E_C^{AlN}-E_C^{GaN}=\Delta E_C$ between the conduction band edges of AlN and GaN, induces the formation of the quantum-confined 2D electron gas at such a heterojunction. The densities that can be induced by the polar discontinuity are limited only by the polarization sheet charge $\sigma_\pi$, and far exceed those achieved by modulation doping or Mott criteria, and do not cause ionized impurity scattering. Such robust polarization induced 2DEGs in Al(Ga)N/GaN heterojunctions have been investigated for the last two decades and contributed to several applications such as ultrafast unipolar transistors and sensors.

If on the other hand, a thin layer of GaN is grown epitaxially on a relaxed AlN substrate, the GaN layer is under tensile strain. For the metal-polar orientation, the polarization difference $$[(P_{sp}^{GaN}+P_{pz}^{GaN})-P_{sp}^{AlN}]\cdot\hat{n}=\sigma_\pi$$

is negative in sign. This negative immobile interface polarization charge should induce positively charged mobile carriers, or holes. The energy band-offset between the valence bands of AlN and GaN, $E_V^{AlN}-E_V^{GaN}=\Delta E_V$ provides the necessary barrier for quantum-confining the holes to 2D. This is schematically shown in the energy band diagram shown in FIG. 1(a), which is a self-consistent solution of a multiband k.p and Scrodinger and Poisson equations for the GaN/AlN heterostructure (see S. Birner, T. Zibold, T. Andlauer, T. Kubis, M. Sabathil, A. Trellakis, P. Vogl, nextnano: General purpose 3-D simulations. *IEEE Trans. Electron Devices*. 54, 2137-2142 (2007)). A mobile 2D hole gas of sheet density close to the fixed interface polarization charge $\rho_\pi \sim 4 \times 10^{13}/cm^2$ is expected to form at the heterojunction, depending on the thickness of the GaN layer. The holes are formed due to the field-ionization (or quantum tunneling) of electrons out of the valence band states into empty, localized surface states.

Figures 1A, 1B, 1C, 1D:
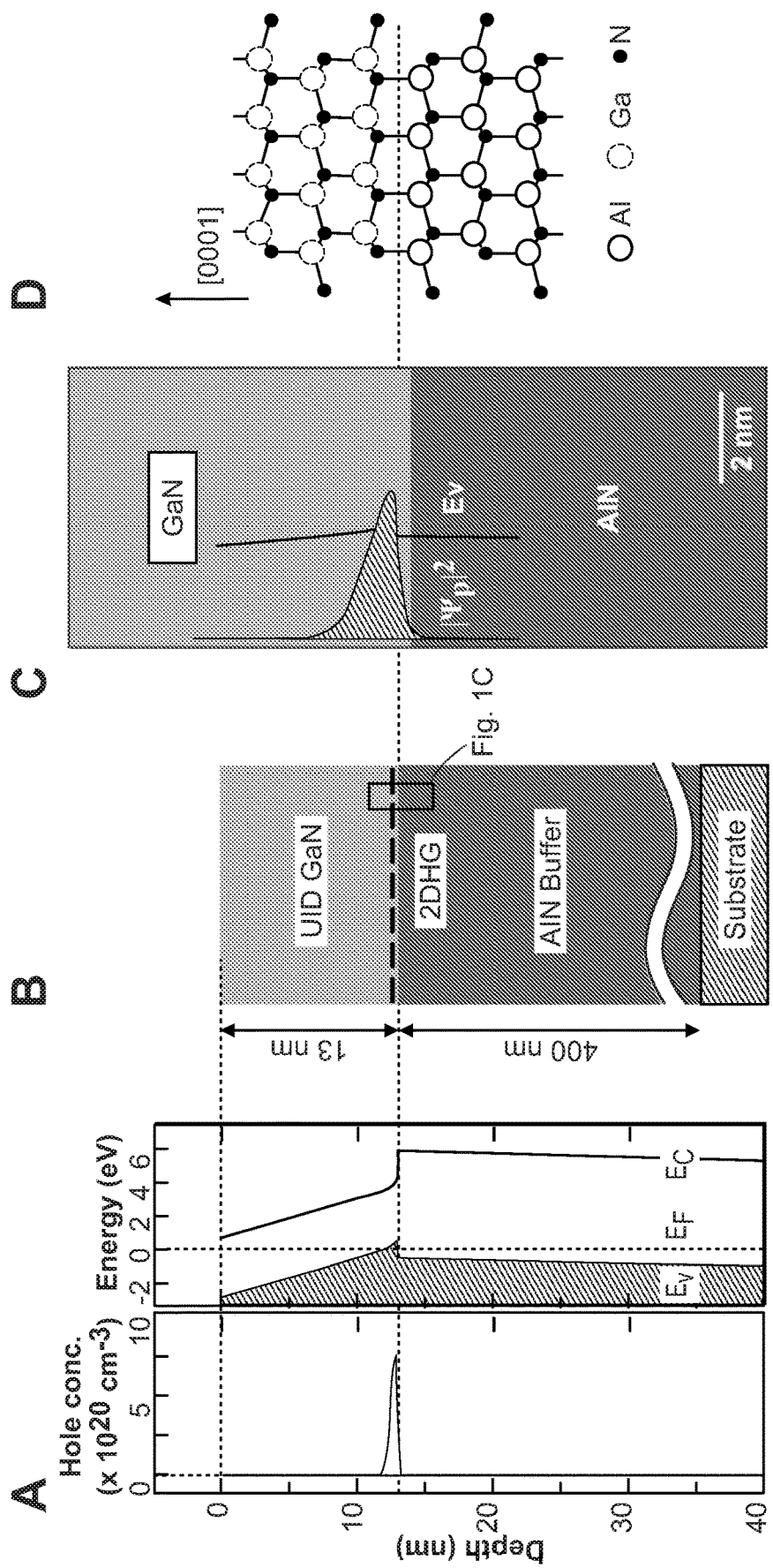
FIGS. 1A-1D show epitaxially grown GaN/AlN heterostructure in one embodiment of these teachings.
Figure 6A:
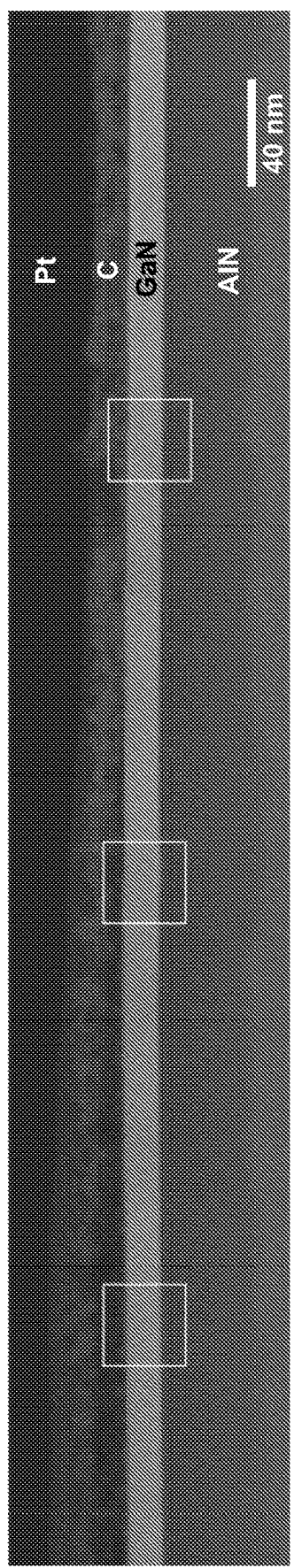
FIGS. 6A, 6B show wide-area STEM annular dark field (ADF) images of the cross-section of the GaN/AlN heterostructure.
Figure 6B:
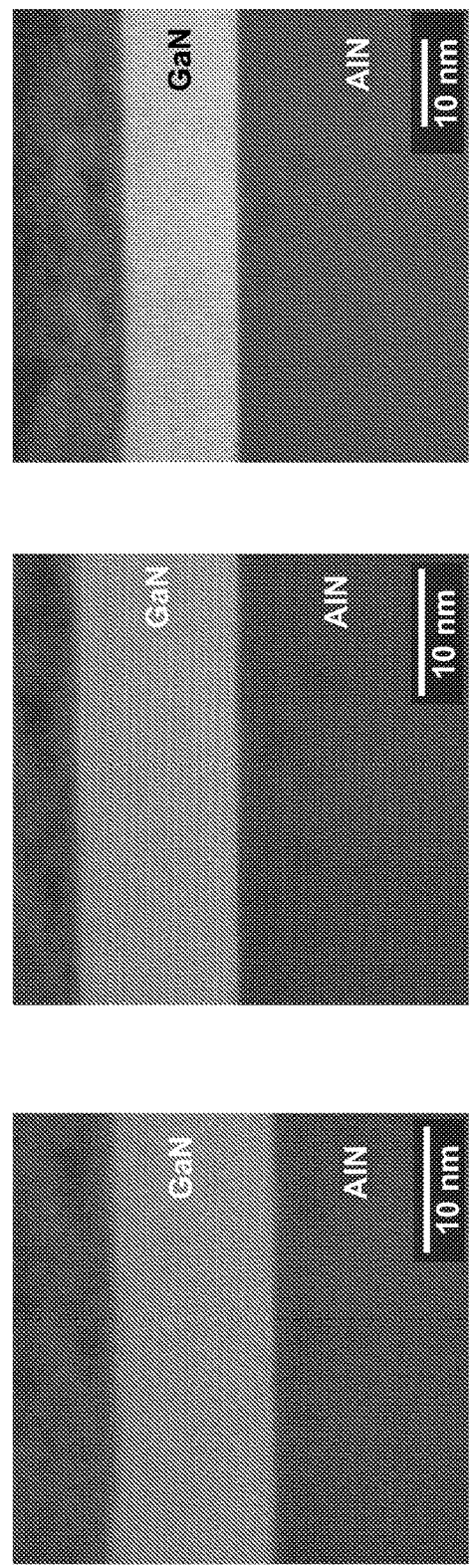

FIG. 1B shows the layer structures that were grown for this exemplary embodiment. A metal-polar AlN surface on a c-plane sapphire crystal was used as the substrate. An GaN/AlN layer was grown on it by molecular beam epitaxy (MBE). FIG. 1C shows a zoomed in lattice image of the crystal heterointerface. A sharp heterojunction is observed, across which GaN and AlN are in the wurtzite crystal structure, and the GaN layer is coherently strained to the AlN layer. Further structural and chemical details of the heterojunction are shown in FIGS. 2A-2C. FIG. 2A shows a smooth surface morphology of the as-grown surface, with rms roughness less than 1 nm in a 10 um×10 um scan area, and clearly resolved atomic steps. FIG. 2B shows the X-ray diffraction spectrum of the heterojunction. The fringes and multiple peaks indicate a smooth few nm thick layer over the entire photon beam size of mms. This is further corroborated by the large width TEM images in the supplementary section FIGS. 6A, 6B. FIG. 2C is the reciprocal-space X-ray map, which proves that the GaN epitaxial layer is coherently strained to the underlying AlN layer, with an extracted biaxial compressive strain of 2.4%. The strain state determines the net piezoelectric polarization charge in the heterostructure. FIGS. 1A-1D and 2A-2C thus collectively show that the heterostructure is structurally and chemically in a form that should exhibit the undoped polarization-induced 2D hole gas, but it is necessary to have control samples to be certain.

FIG. 3A shows the layer structure of three samples: Sample A is an undoped ~13 nm GaN layer on AlN. Sample B is identical to A, except the top 10 nm of GaN are doped with Mg to lock the Fermi level to valence band edge separation, thereby screening the 2DHG from variations of the surface potential. For comparison with conventional acceptor doping, a thick Mg-doped GaN (sample C) was also measured. FIGS. 3, A-C show the temperature-dependent Hall-effect transport properties of the three samples measured from 300 K-10 K. The mobile charge density $n_s = IB/qV_H$ is obtained from the Hall voltage $V_H$ that develops upon driving a current I through the 2D hole gas in a magnetic field B perpendicular to its plane. The Hall voltage results from the Lorentz force $F = q(v \times B)$ which drives holes in a direction opposite to electrons, leading to a positive sign. The carrier mobility $\mu_p = 1/qn_cR_c$ is obtained from the measured sheet resistance $R_s$. The positive slope of the Hall resistance ($V_H/I$) versus magnetic field, and positive Hall-coefficient sign for all samples in these teachings ensures that only holes are being studied and compared.

The resistivity of the Mg-doped bulk GaN control sample C increases sharply with the lowering of temperature, from ~40 kΩ/sq at 300 K to 2 MΩ/sq at ~180 K (FIG. 3A). FIG. 3B shows that this increase in resistivity is almost entirely caused by the ~100× decrease of the thermally generated mobile hole density, which freezes out with an activation energy $E_A \sim 170$ meV. A dramatically different behavior is observed for the undoped heterostructure sample A, and the Mg-doped heterostructure B. They show metallic behavior, with the resistivity decreasing with decreasing temperature, a signature of a degenerate 2D hole gas.

The resistivities of the heterostructures A/B decrease from ~6.0/8.0 kΩ/sq at 300 K to ~1/2 kΩ/sq at 10 K (FIG. 3A). Because the hole densities measured in samples A and B are nearly independent of temperature (FIG. 3B), all the change in the resistivity is caused by an increase in the hole mobility as the temperature is lowered. The high hole sheet densities measured are similar for the doped and undoped heterostructures in samples A and B, because the integrated acceptor sheet density in sample B is only $\sim 5 \times 10^{12}$ cm$^{-2}$, about an order of magnitude lower than the measured mobile hole gas density. This direct measurement, without any other parallel 2DEG or 3D hole channels, thus points to the presence of a high-density polarization-induced 2D hole gas in the undoped heterojunction.

The long-missing polarization-induced two-dimensional hole gas is finally observed in undoped gallium nitride. Experimental results provide unambiguous proof that a 2D hole gas in GaN grown on AlN does not need acceptor doping, and can be formed entirely by the difference in the internal polarization fields across the semiconductor heterojunction. The measured 2D hole gas densities, about $4 \times 10^{13}/$cm$^2$ are among the highest among all known semiconductors, and remain unchanged down to cryogenic temperatures. Some of the lowest sheet resistances of all wide bandgap semiconductors are seen, indicating that the reported results provide a new probe for studying the valence band structure and transport of wide-bandgap nitride interfaces, and simultaneously enable the missing component for gallium nitride based p-channel transistors for energy-efficient electronics.

In these heterostructures, there simply are no other carriers such as parallel electrons channels or parallel 3D hole channels that can mask the direct and unambiguous measurement of the properties of the 2D hole gas. The variation of the measured 2D hole gas mobility with temperature is strongly influenced by acoustic phonon scattering at all temperatures, in addition to the polar optical phonon scattering that dominates in most polar compound semiconductors. It is expected to depend sensitively on the effective mass of the valence bands near the Fermi level, which is strongly influenced by the biaxial compressive strain in the GaN layer at the heterojunction. At the lowest temperatures, when the phonon number is frozen out according the Bose-Einstein distribution, the interface roughness and impurity scattering dominate. Though the hole mobilities do not saturate at ~20K, an extrapolation points to values in the range of ~100-200 cm$^2$/Vs. Since the 2D hole gas density survives to cryogenic temperatures, magnetotransport studies can directly access and probe the nature of the valence band of GaN in future studies. As a further proof of the polarization-induced origin of the 2D hole gas, FIGS. 7A, 7B show that the electrical conductivity of the 2D hole gas varies with the thickness of the GaN layer, with a well-defined critical thickness. This is the exact dual of what is observed in the undoped polarization-induced 2D electron gas in Al(Ga)N/GaN heterostructures, and is a key stepping stone towards the realization of high-voltage p-channel transistors. Table S1 also shows that the 2D hole gases are observed in multiple samples similar to Samples A and B with reproducible properties, constituting conclusive proof.

How do the observed polarization-induced 2D hole gases in the undoped and doped GaN/AlN heterostructures compare to those reported in nitride semiconductors, and in general to hole gases cutting across various semiconductor material systems? This is shown in FIGS. 4A and 4B. FIG.

4A shows that the 2D hole gas densities of $p_{2d}\sim 4\times 10^{13}$ cm$^{-2}$ measured in this disclosure in both the undoped and doped GaN/AlN heterostructures are close to the limit of the difference in polarization between AlN and compressively and coherently strained GaN. This is the dual of the 2D electron gas, where the corresponding limits are also seen in binary AlN/GaN heterojunctions (20). The hole densities are much higher than previously reported 2D hole gas densities in nitride semiconductors. In fact, the densities are among the highest among all semiconductor heterostructures, including SrTiO$_3$/LaAlO$_3$, hydrogen-terminated diamond, strained Ge/SiGe, Si inversion channels, and GaSb/InGaAs as shown in FIG. 4B. The high 2D hole density in the nitride leads to some of the lowest sheet resistances, in spite of lower hole mobilities.

The 2D hole gas mobilities in the wide-bandgap nitrides are not on the high side because of the high valence band effective mass of both heavy and light holes in GaN due to its large bandgap. The Ge/SiGe and GaSb/InGaAs heterojunctions show higher 2D hole gas mobilities due to the smaller valence band effective masses, resulting from their small bandgaps. However, small bandgaps also mean limited capacity to handle high voltages, limiting them to low power applications. The large bandgap of the nitrides means that the high 2D hole gas densities can be modulated effectively with a gate, because the semiconductor intrinsically is capable of sustaining much larger electric fields. It is further conceivable that the hole mobility in the polarization-induced 2D hole gases in the nitride heterojunction could be improved by sharper interfaces, as the junctions studied here have binary semiconductors and have minimal alloy scattering, and scattering from dopants. But the most attractive way to improve the hole mobility may be by engineering the strain such that the valence bands are reordered such that a light effective mass is responsible for in-plane transport in the quantum well. Because the hydrogen present in the popular Metal-Organic Chemical Vapor Deposition (MOCVD) growth environment forms a complex with Mg, inhibiting its capacity to provide holes in GaN, buried p-type layers have been impossible by this popular growth technique because the H$_2$ does not diffuse through n-type layers. Though we have used plasma-MBE growth in this study, the fact that high-density holes are generated without Mg doping suggests that this technique can potentially be achieved also by MOCVD. Because of the fundamentally different origin of the 2D hole gas in the nitrides in the intrinsic polarization fields from broken inversion symmetry, this form of doping is expected to scale down the last lattice constants, and not be affected by random dopant fluctuations. Future generations of small transistors can take advantage of, and someday depend on this unique scaling property of polarization-induced doping—now available in both the n-type and p-type recipes.

These disclosure thus offers an attractive, clean, and technologically relevant platform to implement p-channel high voltage transistors and other devices and to study the materials science and physics emerging in wide bandgap and polar semiconductor heterostructures due to very large built-in electric fields. Strong effects on tunneling and Rashba-induced spin-orbit coupling are expected in these structures. The first unambiguous observation of the elusive polarization-induced 2D hole gas in undoped nitride semiconductor heterostructures thus completes a long search for its existence. Together with its dual, the polarization-induced 2D electron gas, wide-bandgap complementary logic electronics is now within reach.

An example of p-channel high voltage transistors using the present teachings is provided in U.S. Patent Application Publication No, 20200144407, for an application claiming priority of U.S. Provisional Application No. 62/756,874, entitled A HIGH-VOLTAGE P-CHANNEL FET BASED ON III-NITRIDE HETEROSTRUCTURES, filed on Nov. 7, 2018, both of which are incorporated by reference herein in their entirety and for all purposes.

Making and Using the Exemplary Embodiment

The 2DHG is obtained intrinsically by epitaxially growing the desired III-nitride semiconductor crystal heterostructure of Gallium Nitride on Aluminum Nitride. In our case, we have demonstrated using PA-MBE (as described below), but the structure can be grown using other methods as well like metal organic chemical vapour deposition (MOCVD) etc. (It should be noted that heterostructures using the other polarity or including wide bandgap oxide semiconductor materials (of one polarity or of the other polarity) can be fabricated using either MBE or MOCVD.)

The III-nitride heterostructures were epitaxially grown using plasma-assisted molecular beam epitaxy (PA-MBE) system. Both the doped and undoped GaN/AlN structures were grown on a starting substrate of commercially available 1 micron thick semi-insulating Al-face [0001] AlN on c-plane sapphire templates from DOWA. 8 mm×8 mm diced substrate pieces were ultrasonicated in acetone, methanol and isopropanol in succession before being mounted on a 3-inch lapped Si carrier wafer using molten Indium. The samples were then loaded into the MBE system, and outgassed at 200° C. for 8 hours in a load-lock chamber, followed by at 500° C. for 2 hours in a clean preparation chamber. They were then introduced into the MBE growth chamber and heated to the desired growth temperature. Effusion cells filled with ultra-high-purity sources were used for Ga, Al and Mg beams, whereas a RF plasma source with ultra-high-purity N$_2$ gas flowing through a mass-flow-controller and a purifier was used to provide the active N flux. The entire heterostructures reported in this work were grown at a N$_2$ RF power of 400 W, resulting in a growth rate of ~560 nm/hr. A ~400 nm thick AlN buffer was first grown at a thermocouple temperature T$_{TC}$=780° C., with an effective beam-equivalent Al flux of ~9×10$^{-7}$ Torr. Care was taken while growing the AlN buffer to reduce impurity contamination from the substrate surface. In order to maintain an abrupt heterointerface for the 2D hole gas, the excess Al on the growth surface was consumed by opening only the N shutter and monitoring the reflection high energy electron diffraction (RHEED) intensity till it saturates. The sample was then cooled to T$_{TC}$=730° C. for the growth of the GaN layer. Approximately ~13 nm of unintentionally doped GaN was grown under an effective Ga flux of ~1.0×10$^{-6}$ Torr. For the undoped structures, the Mg source was kept cold, and the shutter closed throughout, to avoid unintentional p-type doping of the GaN cap layers. On the other hand, for the doped GaN/AlN structures, during the last ~10 nm of GaN growth, the Mg source shutter was opened to incorporate Mg acceptor dopants.

Materials and Methods

The III-nitride heterostructures studied in this work were epitaxially grown in a Veeco Gen10 plasma-assisted molecular beam epitaxy (PA-MBE) system. Both the doped and undoped GaN/AlN structures were grown on a starting substrate of commercially available 1 micron thick semi-insulating Al-face [0001] AlN on c-plane sapphire templates from DOWA. 8 mm×8 mm diced substrate pieces were ultrasonicated in acetone, methanol and isopropanol in succession before being mounted on a 3-inch lapped Si carrier wafer using molten Indium. The samples were then loaded into the MBE system, and outgassed at 200° C. for 8 hours in a load-lock chamber, followed by at 500° C. for 2 hours in a clean preparation chamber. They were then introduced into the MBE growth chamber and heated to the desired growth temperature. Effusion cells filled with ultra-high-purity sources were used for Ga, Al and Mg beams, whereas a RF plasma source with ultra-high-purity $N_2$ gas flowing through a mass-flow-controller and a purifier was used to provide the active N flux. The entire heterostructures reported in this work were grown at a $N_2$ RF power of 400 W, resulting in a growth rate of ~560 nm/hr. A ~400 nm thick AlN buffer was first grown at a thermocouple temperature $T_{TC}$=780° C., with an effective beam-equivalent Al flux of ~9×10$^{-7}$ Torr. Care was taken while growing the AlN buffer to reduce impurity contamination from the substrate surface. In order to maintain an abrupt heterointerface for the 2D hole gas, the excess Al on the growth surface was consumed by opening only the N shutter and monitoring the reflection high energy electron diffraction (RHEED) intensity till it saturates. The sample was then cooled to $T_{TC}$=730° C. for the growth of the GaN layer. Approximately ~13 nm of unintentionally doped GaN was grown under an effective Ga flux of ~1.0×10$^{-6}$ Torr. For the undoped structures, the Mg source was kept cold, and the shutter closed throughout, to avoid unintentional p-type doping of the GaN cap layers. On the other hand, for the doped GaN/AlN structures, during the last ~10 nm of GaN growth, the Mg source shutter was opened to incorporate Mg acceptor dopants. The Mg acceptor concentrations NA in the doped samples were verified to be between ~5×10$^{18}$ cm$^{-3}$ to ~1×10$^{19}$ cm$^{-3}$ in different samples, as calibrated by secondary ion mass spectrometry (SIMS) measurements performed on a separate p-type doping calibration sample grown under the same epitaxial conditions.

Atomic force microscopy (AFM) scans performed in a Bruker ICON Dimension system after MBE growth showed a smooth surface with sub-nm rms roughness over both a large area 10 um×10 um scan and smaller area 2 um×2 um scans. X-ray diffraction measurements were performed in a Panalytical XRD system using the Cu-Kα line source. A 2theta scan along the (002) symmetric peak of the AlN/GaN structure showed the AlN and GaN reflection peaks and confirmed the thicknesses of the layers by comparing and fitting to a simulated model diffraction spectrum. The reciprocal space map (RSM) around the (105) asymmetric reflection of the epitaxial heterostructure was examined to extracted the following in-plane and out-of-plane lattice constants: $a_{AlN}$=0.311 nm, $a_{GaN}$=0.311 nm and $c_{AlN}$=0.4985 nm, $C_{GaN}$=0.5241 nm. Comparing to the unstrained lattice constant, the GaN layer is under ~2.41% compressive strain. Scanning transmission electron microscopy (STEM) was performed on a FEI Titan Themis CryoS/TEM. A thin cross-section sample was prepared using focused ion beam (FIB) and imaged using the annular dark field (ADF) mode of the STEM. The wide area scans shown in FIGS. 6A, 6B confirmed the abrupt interface between the GaN and AlN.

Hall-effect measurements at 300K and 77K were first performed on all the grown samples using a Nanometric Hall-Effect System. The transport data of a selection of samples are tabulated in Table S1. These samples were grown over different growth days, and illustrate the high repeatability of the 2D hole gas. These data are included in the benchmark plot in FIG. 4. One of the doped heterostructure, and one undoped heterostructure (samples A2 and B4 in Table S1) were further characterized by measuring the temperature dependent Hall effect from 300K to 20K, at 1T magnetic field in a Lakeshore closed-cycle cryogenic stage. The data is presented in the main text FIG. 3.

TABLE S1

| Sample | [Mg] in GaN (cm$^{-3}$) | Temp. (K) | $\mu_{Hall}$ (cm$^2$/V.S) | σ (cm$^{-2}$) | $R_{Sheet}$ (Ω/□) |
|---|---|---|---|---|---|
| A1 | undoped | 300 | 9.28 | 5.35 × 10$^{13}$ | 1.26 × 10$^4$ |
|  |  | 77 | 40.3 | 3.14 × 10$^{13}$ | 4927 |
| A2 | undoped | 300 | 10.1 | 5.24 × 10$^{13}$ | 1.18 × 10$^4$ |
|  |  | 77 | 48 | 2.74 × 10$^{13}$ | 4751 |
| A3 | undoped | 300 | 10.8 | 4.66 × 10$^{13}$ | 1.24 × 10$^4$ |
|  |  | 77 | 26.3 | 5.03 × 10$^{13}$ | 4715 |
| A4* | undoped | 300 | 23.11 | 4.568 × 10$^{13}$ | 5915 |
|  |  | 77 | 105.8 | 3.406 × 10$^{13}$ | 1733 |
| B1 | 1 × 10$^{19}$ | 300 | 19.8 | 4.66 × 10$^{13}$ | 6766 |
|  |  | 77 | 78.8 | 3.81 × 10$^{13}$ | 2081 |
| B2 | 1 × 10$^{19}$ | 300 | 18.6 | +4.518e13 | 7444 |
|  |  | 77 | 79.2 | +3.640e13 | 2166 |
| B3 | 1 × 10$^{19}$ | 300 | 20.7 | 4.73 × 10$^{13}$ | 6364 |
|  |  | 77 | 71.2 | 3.93 × 10$^{13}$ | 2232 |
| B4* | 5 × 10$^{18}$ | 300 | 18.8 | 4.37 × 10$^{13}$ | 7595 |
|  |  | 77 | 102 | 3.72 × 10$^{13}$ | 1647 |

Table S1.

Table S1 shows Hall-effect measurement data for several MBE grown GaN/AlN heterostructures showing the reproducibility of the 2D hole gas properties in undoped and doped structures. Samples A1-A3 are undoped heterostructures, whereas samples B1-B3 have ~10 nm thick Mg-doped p-type GaN caps on the top of a UID GaN layer grown on AlN. Samples A2 and B4 were also measured using temperature dependent Hall effect, and are presented in the main text in FIG. 3. The data clearly shows the presence of a highly repeatable 2D hole gas, both in the doped and undoped heterostructures.

FIGS. 7A, 7B shows the measured variation of the 2D hole gas conductivity with changing GaN layer thickness for an undoped 2DHG heterostructure. FIG. 7A shows the expected change with thickness in the energy band diagram of the valence band, and the mobile hole concentration with depth, as simulated using a self-consistent multiband k.p Schrodinger-Poisson solver (18). A typical bare-GaN surface conduction band edge barrier height of 0.7 eV was used for the simulations. By combining the simulations with experimentally measured hole mobilities, we can obtain the 2D hole gas conductivity expected as a function of GaN thickness and temperature. The solid lines in FIG. 7B respectively for calculating the hole sheet conductivity. The solid lines indicate a critical thickness of ~5 nm below which the 2DHG is depleted from the surface potential, a sharp rise from ~5-20 nm, beyond which the hole density saturates to the interface polarization sheet density. The measured 2D hole gas conductivity should follow a similar trend. To test this, a thick 30 nm undoped GaN on AlN sample was grown. It was successively dry-etched using low power, a low damage RIE/ICP etch process to the desired thicknesses. The sheet resistances were measured by Hall-effect after every etch step at both 300K and 77K. The measured conductivity is plotted in FIG. 7B alongside the solid lines predicted from the polarization discontinuity and a fixed surface barrier height. The reasonable agreement to the simulated model is a further proof that the 2D hole gas is indeed polarization-induced.

The exemplary embodiments were made by an epitaxial technique such as MBE or MOCVD on Aluminum Nitride substrates. As stated above, a variety of substrates are within the scope of these teachings.

Apart from the "doped" and "undoped" variations of the 2DHG GaN/AlN heterostructure, other variations are within the scope of these teachings.

Figures 5A, 5B:
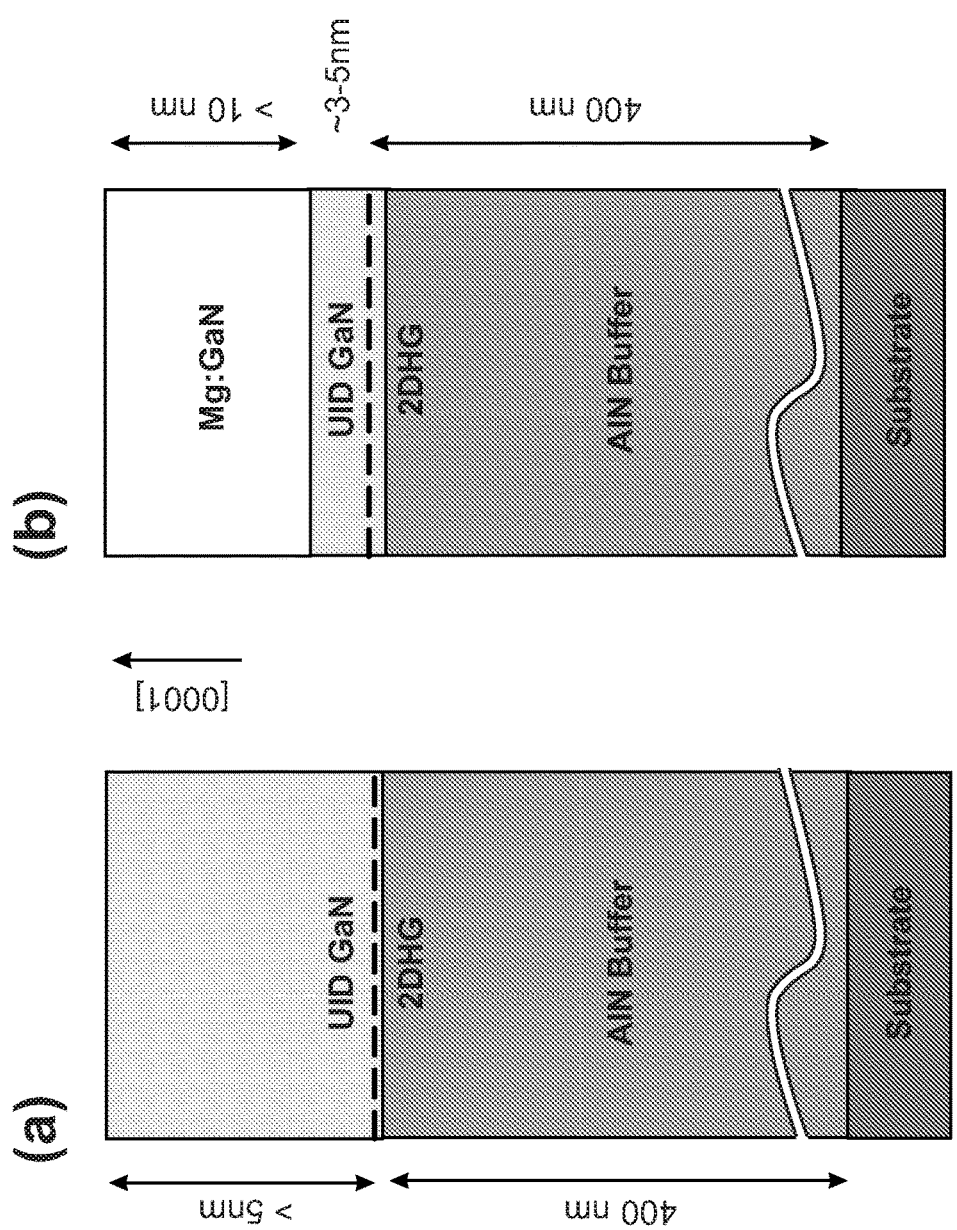
FIGS. 5A, 5B represent a summary view of embodiments of these teachings.

FIG. 5 presents a summary view of these teachings.

Although these teachings has been described with respect to various embodiments, it should be realized these teachings are also capable of a wide variety of further and other embodiments within the spirit and scope of the appended claims.

What is claimed is:

1. A Group III nitride semiconductor device comprising:
a first layer of a first polar undoped Group III nitride material grown on an undoped substrate material; and
a second layer of an undoped second polar Group III nitride material epitaxially grown on the first layer of the first polar undoped Group III nitride material;
wherein a difference between a normal component of a polarization of the second layer of the undoped second polar Group III nitride material and the first layer of the first polar undoped Group III nitride material is negative; and wherein there is an energy band offset between valence bands of the first polar undoped Group III nitride material and the undoped second polar Group III nitride material; an energy bandgap of the undoped second polar Group III nitride material being smaller than an energy bandgap of the first polar undoped Group III nitride material; and
a 2D hole gas at a heterojunction between the first layer of the first polar undoped Group III nitride material and the second layer of the undoped second polar Group III nitride material; a 2D electron gas not being present.

2. The Group III nitride semiconductor device of claim 1, further comprising a layer of p-doped second polar Group III nitride material disposed on the second layer of the undoped second polar Group III nitride material.

3. The Group III nitride semiconductor device of claim 1, wherein the first polar undoped Group III nitride material is undoped polar AlN and the second polar Group III nitride material is undoped polar GaN.

4. The Group III nitride semiconductor device of claim 3, further comprising a layer of p doped polar GaN disposed on the second layer of the undoped second polar Group III nitride material.

5. The Group III nitride semiconductor device of claim 1, wherein the undoped substrate material is one of Sapphire, c-plane Sapphire, undoped bulk single crystal AlN, undoped bulk single crystal polar AlN, silicon carbide, Si-face silicon carbide or silicon.

6. The Group III nitride semiconductor device of claim 1, wherein mobile electrons are not present.

7. The Group III nitride semiconductor device of claim 1, wherein the 2D hole gas has a sheet density based upon a thickness of the second layer.

8. The Group III nitride semiconductor device of claim 1, wherein the first polar undoped Group III nitride material is undoped polar AlN and the second polar Group III nitride material is one of undoped polar $In_xGa_{1-x}N$ or $Al_xGa_{1-x}N$ where x is a number less than 1 and greater than 0.

9. The Group III nitride semiconductor device of claim 1, wherein the first polar undoped Group III nitride material is undoped polar $Al_xGa_{1-x}N$ and the second polar Group III nitride material is one of undoped polar GaN or $In_xGa_{1-x}N$ where x is a number less than 1 and greater than 0.

10. The Group III nitride semiconductor device of claim 1, wherein the first polar undoped Group III nitride material is undoped polar $Al_xIn_yGa_{(1-(x+y))}N$ where x and y are numbers less than 1 and greater than 0, a sum of x and y being less than 1, and the second polar Group III nitride material is undoped polar GaN.

11. The Group III nitride semiconductor device of claim 1, wherein the first polar undoped Group III nitride material and the undoped second polar Group III nitride material are metal polar Group III nitride materials.

12. The Group III nitride semiconductor device of claim 1, wherein the first polar undoped Group III nitride material and the undoped second polar Group III nitride material are N polar Group III nitride materials.

13. A method for fabricating a Group III nitride semiconductor device having a 2D hole gas, the method comprising:
depositing a first layer of a first polar undoped Group III nitride material on an undoped substrate; and
epitaxially growing a second layer of an undoped second polar Group III nitride material on the first layer of the first polar undoped Group III nitride material;
wherein a difference between a normal component of a polarization of the second layer of the undoped second polar Group III nitride material and the first layer of the first polar undoped Group III nitride material is negative; and wherein there is an energy band offset between valence bands of the first polar undoped Group III nitride material and the undoped second polar Group III nitride material; an energy bandgap of the undoped second polar Group III nitride material being smaller than an energy bandgap of the first polar undoped Group III nitride material; and
a 2D hole gas being formed at a heterojunction between the first layer of the first polar undoped Group III nitride material and the second layer of the undoped second polar Group III nitride material; a 2D electron gas not being present.

14. The method of claim 13 further comprising depositing a layer of p doped second polar Group III nitride material disposed on the second layer of the undoped second polar Group III nitride material.

15. The method of claim 13 wherein the first polar undoped Group III nitride material is undoped polar AlN and the second polar Group III nitride material is polar GaN.

16. The method of claim 13 wherein the first polar undoped Group III nitride material is undoped polar $Al_xGa_{1-x}N$ and the second polar Group III nitride material is one of undoped polar GaN or $In_xGa_{1-x}N$ where x is a number less than 1 and greater than 0.

17. The method of claim 13 wherein the first polar undoped Group III nitride material is undoped polar AlN and the second polar Group III nitride material is one of undoped polar $In_xGa_{1-x}N$ or $Al_xGa_{1-x}N$ where x is a number less than 1 and greater than 0.

18. The method of claim 13 wherein the first polar undoped Group III nitride material is undoped polar $Al_xIn_yGa_{(1-(x+y))}N$ where x and y are numbers less than 1 and greater than 0, a sum of x and y being less than 1, and the second polar Group III nitride material is undoped polar GaN.

19. The method of claim 13 wherein the undoped substrate material is one of Sapphire, c-plane Sapphire, undoped bulk single crystal AlN, undoped bulk single crystal polar AlN, silicon carbide, Si-face silicon carbide or silicon.

20. The method of claim 13 wherein the first polar undoped Group III nitride material and the undoped second polar Group III nitride material are metal polar Group III nitride materials.

21. The method of claim 13 wherein the first polar undoped Group III nitride material and the undoped second polar Group III nitride material are N polar Group III nitride materials.

22. A Group II or Group III oxide semiconductor device comprising:
- a first layer of a first polar undoped Group II or Group III oxide material grown on an undoped substrate material; and
- a second layer of an undoped second polar Group II or Group III oxide material epitaxially grown on the first layer of the first polar undoped Group II or Group III oxide material;
- wherein a difference between a normal component of a polarization of the second layer of the undoped second polar Group II or Group III oxide material and the first layer of the first polar undoped Group II or Group III oxide material is negative; and wherein there is an energy band offset between valence bands of the first polar undoped Group II or Group III oxide material and the undoped second polar Group II or Group III oxide material; and
- a 2D hole gas at a heterojunction between the first layer of the first polar undoped Group II or Group III oxide material and the second layer of the undoped second polar Group II or Group III material; a 2D electron gas not being present.

23. The Group II or Group III oxide semiconductor device of claim 22, wherein mobile electrons are not present.

24. The Group II or Group III oxide semiconductor device of claim 22, wherein the first polar undoped Group II or Group III oxide material is undoped polar ZnO and the second polar Group II or Group III oxide material is undoped polar $Zn_xMg_{1-x}O$ where x is a number less than 1 and greater than 0.

25. The Group II or Group III oxide semiconductor device of claim 22, wherein the first polar undoped Group II or Group III oxide material is undoped polar $Ga_2O_3$ and the second polar Group II or Group III oxide material is one of undoped polar $(Al_{-x}Ga_{1-x})_2O_3$ where x is a number less than 1 and greater than 0.

26. The Group II or Group III oxide semiconductor device of claim 22, wherein the first polar undoped Group II or Group III oxide material and the undoped second polar Group II or Group III oxide material are metal polar Group II or Group III oxide materials.

27. The Group II or Group III oxide semiconductor device of claim 22, wherein the first polar undoped Group II or Group III oxide material and the undoped second polar Group II or Group III oxide material are O polar Group II or Group III oxide materials.

28. A method for fabricating a Group II or Group III oxide semiconductor device having a 2D hole gas, the method comprising:
- depositing a first layer of a first polar undoped Group II or Group III oxide material on an undoped substrate; and
- epitaxially growing a second layer of an undoped second polar Group II or Group III oxide material on the first layer of the first polar undoped Group II or Group III oxide material;
- wherein a difference between a normal component of a polarization of the second layer of the undoped second polar Group II or Group III oxide material and the first layer of the first polar undoped Group II or Group III oxide material is negative; and wherein there is an energy band offset between valence bands of the first polar undoped Group II or Group III oxide material and the undoped second polar Group II or Group III oxide material; and
- a 2D hole gas being formed at a heterojunction between the first layer of the first polar undoped Group II or Group III oxide material and the second layer of the undoped second polar Group II or Group III oxide material; a 2D electron gas not being present.

29. The method of claim 28, wherein the first polar undoped Group II or Group III oxide material is undoped polar ZnO and the second polar Group II or Group III oxide material is undoped polar $Zn_xMg_{1-x}O$ where x is a number less than 1 and greater than 0.

30. The method of claim 28, wherein the first polar undoped Group II or Group III oxide material is undoped polar $Ga_2O_3$ and the second polar Group II or Group III oxide material is one of undoped polar $(Al_xGa_{1-x})_2O_3$ where x is a number less than 1 and greater than 0.

31. The method of claim 28 wherein the first polar undoped Group II or Group III oxide material and the undoped second polar Group II or Group III oxide material are metal polar Group II or Group III oxide materials.

32. The method of claim 28 wherein the first polar undoped Group II or Group III oxide material and the undoped second polar Group II or Group III oxide material are O polar Group II or Group III oxide materials.

33. A Group III nitride semiconductor device comprising multiple repeated substructures; a first substructure from the multiple repeated substructures being grown on an undoped substrate; the multiple repeated substructures comprising undoped Group III nitride material; wherein at least some substructures from the multiple repeated substructures comprise:
- a first layer of undoped first polar Group III nitride material; and
- a second layer of an undoped second polar Group III nitride material epitaxially grown on the first layer of the first polar undoped Group III nitride material;
- wherein a difference between a normal component of a polarization of the second layer of the undoped second polar Group III nitride material and the first layer of the undoped first polar Group III nitride material is negative; and wherein there is an energy band offset between valence bands of the first polar undoped Group III nitride material and the undoped second polar Group III nitride material; and
- a 2D hole gas at a heterojunction between the each layer of the undoped first polar Group III nitride material and the undoped second polar Group III nitride material; a 2D electron gas not being present; mobile electrons not being present in the substructure.

34. The Group III nitride semiconductor device of claim 33, wherein the undoped first polar Group III nitride material and the undoped second polar Group III nitride material are metal polar Group III nitride materials.

35. The Group III nitride semiconductor device of claim 33, wherein the undoped first polar Group III nitride material and the undoped second polar Group III nitride material are N polar Group III nitride materials.

36. A Group III or Group II oxide semiconductor device comprising of multiple repeated substructures, the substructures comprising layer of polar undoped Group III or Group II oxide material; a first substructure from the multiple repeated substructures being grown on an undoped substrate; wherein at least some substructures from the multiple repeated substructures comprise:

a first layer of undoped first polar Group III or Group II oxide material; and a second layer of an undoped second polar Group III or Group II oxide material epitaxially grown on the first layer of the first polar undoped Group III or Group II oxide material;

wherein a difference between a normal component of the polarization of the second layer of the undoped second polar Group III or Group II oxide material and the first layer of the first polar undoped Group III or Group II oxide material is negative; and wherein there is an energy band offset between valence bands of the first polar undoped Group III or Group II oxide material and the undoped second polar Group III or Group II oxide material; and a 2D hole gas at a heterojunction between the each layer of the first polar undoped Group III or Group II oxide material and the second undoped second polar Group III or Group II oxide material; a 2D electron gas not being present and mobile electrons not being present in the substructure.

37. The Group II or Group III oxide semiconductor device of claim 36 wherein the undoped first polar Group III or Group II oxide material and the undoped second polar Group III or Group II oxide material are metal polar Group II or Group III oxide materials.

38. The Group II or Group III oxide semiconductor device of claim 36 wherein the undoped first polar Group III or Group II oxide material and the undoped second polar Group III or Group II oxide material are O polar Group II or Group III oxide materials.

* * * * *